United States Patent
Lee et al.

(10) Patent No.: US 11,676,263 B2
(45) Date of Patent: Jun. 13, 2023

(54) EXTREME ULTRAVIOLET (EUV) COLLECTOR INSPECTION APPARATUS AND METHOD

(71) Applicant: Samsung Electronics Co., Ltd., Suwon-si (KR)

(72) Inventors: Dong-Hyub Lee, Hwaseong-si (KR); Kyungsik Kang, Bucheon-si (KR); Jeong-Gil Kim, Hwaseong-si (KR); Jinyong Kim, Yongin-si (KR); Hochul Kim, Seoul (KR); Yozo Matsuda, Suwon-si (KR); Youngduk Suh, Seoul (KR); Seungkoo Lee, Seoul (KR); Sungho Jang, Hwaseong-si (KR); Yoojin Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 57 days.

(21) Appl. No.: 17/529,403

(22) Filed: Nov. 18, 2021

(65) Prior Publication Data
US 2022/0309643 A1    Sep. 29, 2022

(30) Foreign Application Priority Data
Mar. 23, 2021    (KR) .................. 10-2021-0037441

(51) Int. Cl.
*G06T 7/00* (2017.01)
*G02B 5/10* (2006.01)
(Continued)

(52) U.S. Cl.
CPC ......... *G06T 7/0004* (2013.01); *G01M 11/005* (2013.01); *G02B 5/0816* (2013.01); *G02B 5/0891* (2013.01); *G02B 5/10* (2013.01); *G02B 5/208* (2013.01); *G02B 27/1013* (2013.01); *G03F 7/70916* (2013.01); *H04N 23/56* (2023.01); *G06T 2207/10152* (2013.01)

(58) Field of Classification Search
CPC ..... G06T 7/0004; G01M 11/005; H04N 23/56
See application file for complete search history.

(56) References Cited

U.S. PATENT DOCUMENTS 7,462,841 B2    12/2008    Franken et al.
7,462,850 B2    12/2008    Banine et al.
(Continued)

FOREIGN PATENT DOCUMENTS

JP    5218014 B2    6/2013

*Primary Examiner* — Jayanti K Patel
*Assistant Examiner* — Christopher Kingsbury Glover
(74) *Attorney, Agent, or Firm* — Muir Patent Law, PLLC

(57) ABSTRACT

An extreme ultraviolet (EUV) collector inspection apparatus and method capable of precisely inspecting a contamination state of an EUV collector and EUV reflectance in accordance with the contamination state are provided. The EUV collector inspection apparatus includes a light source arranged in front of an EUV collector to be inspected and configured to output light in a visible light (VIS) band from UV rays, an optical device configured to output narrowband light from the light, and a camera configured to perform imaging from an UV band to a VIS band. An image by wavelength of the EUV collector is obtained by using the optical device and the camera and a contamination state of the EUV collector is inspected.

20 Claims, 20 Drawing Sheets

(51) Int. Cl.
*G02B 5/20* (2006.01)
*G02B 5/08* (2006.01)
*G01M 11/00* (2006.01)
*G03F 7/20* (2006.01)
*H04N 23/56* (2023.01)
*G02B 27/10* (2006.01)
*G03F 7/00* (2006.01)

(56) References Cited

U.S. PATENT DOCUMENTS

| | | |
|---|---|---|
| 7,518,128 B2 | 4/2009 | Herpen et al. |
| 7,598,503 B2 | 10/2009 | Herpen et al. |
| 7,737,418 B2 | 6/2010 | Herpen et al. |
| 7,750,326 B2 | 7/2010 | Herpen et al. |
| 9,073,098 B2 | 7/2015 | Dea et al. |
| 9,539,622 B2 | 1/2017 | Ershov |
| 9,857,690 B2 | 1/2018 | Kim et al. |
| 10,493,504 B2 | 12/2019 | Ershov |
| 10,747,119 B2 | 8/2020 | Huang et al. |
| 2006/0216912 A1* | 9/2006 | Bristol .................... G21K 1/06 438/471 |
| 2008/0218709 A1 | 9/2008 | Vliet et al. |
| 2011/0255068 A1* | 10/2011 | Kools .................. G02B 5/0891 355/71 |
| 2013/0207004 A1* | 8/2013 | Ceglio ................ G03F 7/70166 359/350 |
| 2020/0103433 A1 | 4/2020 | Lai et al. |
| 2022/0308339 A1* | 9/2022 | Lim .................... G03F 7/70925 |

\* cited by examiner

EXTREME ULTRAVIOLET (EUV) COLLECTOR INSPECTION APPARATUS AND METHOD

CROSS-REFERENCE TO RELATED APPLICATION

This application is based on and claims priority under 35 U.S.C. § 119 to Korean Patent Application No. 10-2021-0037441, filed on Mar. 23, 2021, in the Korean Intellectual Property Office, the disclosure of which is incorporated by reference herein in its entirety.

BACKGROUND

The inventive concept relates to inspection apparatus and method, and more particularly, to an extreme ultraviolet (EUV) collector inspection apparatus and method for inspecting whether an EUV collector included in EUV equipment is contaminated.

EUV equipment used in a laser produced plasma (LPP) method may generate EUV light from tin (Sn) plasma generated by focusing a high-output carbon dioxide ($CO_2$) laser on an Sn droplet. Because the EUV light generated by the Sn droplet spreads in all directions centered on the Sn droplet, in order to use the EUV light in a semiconductor exposure process, an EUV collector or a reflector re-focusing the EUV light on a desired position may be essential. In the EUV equipment, the EUV collector is positioned around the Sn droplet so as to easily re-focus the EUV light and a surface of the EUV collector may be contaminated by various by-products generated by the Sn droplet being vaporized or made plasma or plasma. The EUV collector of which surface is contaminated reduces EUV reflectance and deteriorates productivity of the EUV equipment.

SUMMARY

The inventive concept relates to an extreme ultraviolet (EUV) collector inspection apparatus and method capable of precisely inspecting contamination of an EUV collector and EUV reflectance in accordance with the contamination of the EUV collector.

According to an aspect of the inventive concept, there is provided an EUV collector inspection apparatus including a light source arranged in front of an EUV collector to be inspected and configured to output light of a visible light (VIS) band from ultraviolet (UV) rays, an optical device configured to output narrowband light from the light, and a camera configured to perform imaging from a UV band to the VIS band. An image by a wavelength for the EUV collector is obtained by using the optical device and the camera and a contamination state of the EUV collector is inspected.

According to an aspect of the inventive concept, there is provided an EUV collector inspection apparatus including a stage on which an EUV collector to be inspected is arranged and which is configured to support the EUV collector, a broadband light source arranged in front of the EUV collector and configured to output light of a visible light (VIS) band from ultraviolet (UV) rays, an optical device arranged in front of the broadband light source and configured to transmit set narrowband light from the light or to split the light into narrowband light, and a camera configured to perform imaging on the light output through the optical device and to generate an image by wavelength. The EUV collector is a part configured to focus and output EUV light from a plasma based EUV generating apparatus. The camera is a highly sensitive camera configured to perform imaging from a UV band to the VIS band. A contamination state of the EUV collector is inspected based on the image by wavelength.

According to an aspect of the inventive concept, there is provided an EUV collector inspection method including primarily washing an EUV collector to be inspected, calculating first EUV reflectance of the EUV collector based on an image of an ultraviolet (UV) band for the EUV collector, calculating life expectancy of the EUV collector based on image by wavelength from the UV band to a VIS band when the first EUV reflectance is no less than a first reference, calculating second EUV reflectance of the EUV collector when the life expectancy of the EUV collector is no less than a second reference, and processing the EUV collector to be passed when the second EUV reflectance is no less than a third reference.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
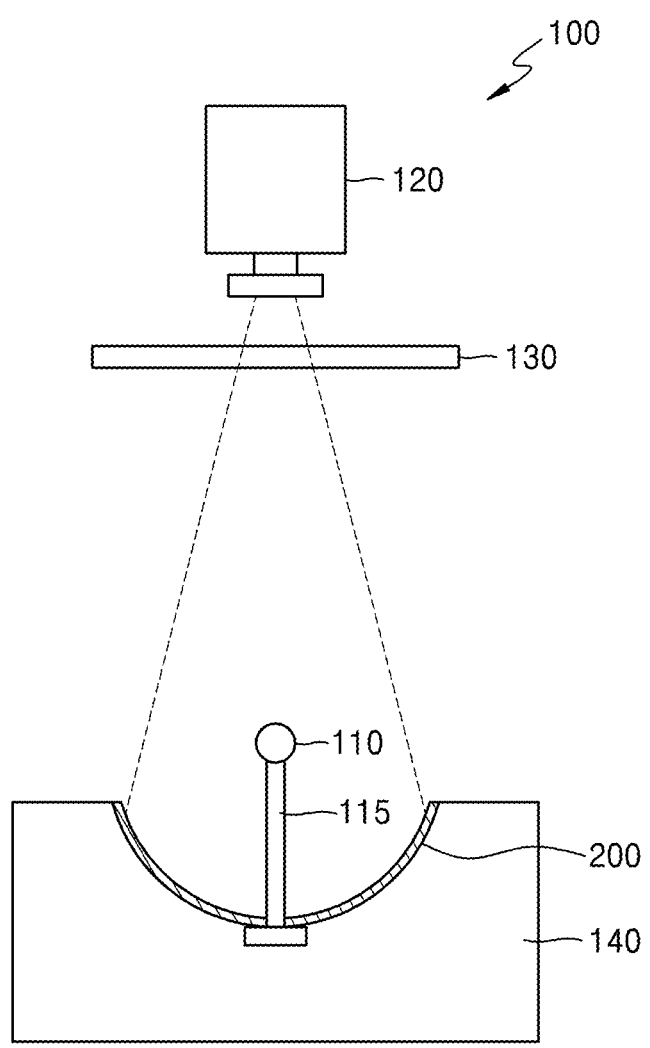
FIG. 1 is a structure diagram schematically illustrating an extreme ultraviolet (EUV) collector inspection apparatus, according to an example embodiment of the inventive concept.

Hereinafter, embodiments of the inventive concept will be described in detail with reference to the accompanying drawings. Like reference numerals refer to like elements throughout and duplicative description thereof will not be given.

Figure 2:
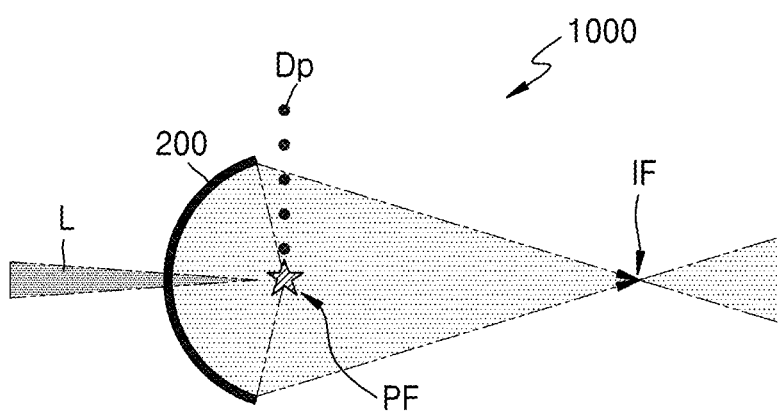
FIG. 2 is a conceptual diagram schematically illustrating an EUV generating apparatus including an EUV collector.
Figure 3:
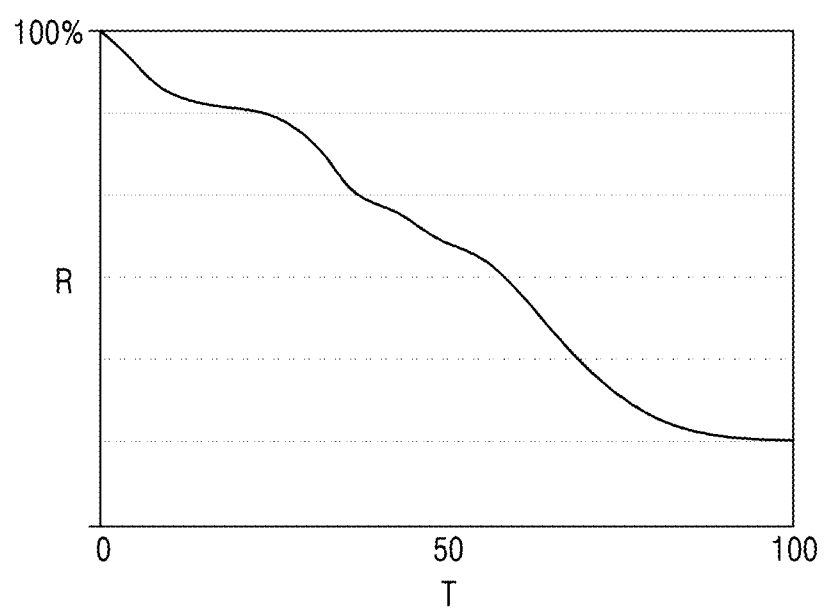
FIG. 3 is a graph illustrating contamination of an EUV collector over time.

FIG. 1 is a structure diagram schematically illustrating an extreme ultraviolet (EUV) collector inspection apparatus 100 according to an example embodiment of the inventive concept. FIG. 2 is a conceptual diagram schematically illustrating an EUV generating apparatus including an EUV collector 200. FIG. 3 is a graph illustrating a contamination of an EUV collector 200 over time.

Referring to FIGS. 1 to 3, the EUV collector inspection apparatus 100 according to an example embodiment as an apparatus for inspecting the contamination of the EUV collector 200 of the EUV generating apparatus may obtain an image by wavelength for the EUV collector 200 and may inspect the contamination of the EUV collector 200 and/or calculate EUV reflectance of the EUV collector 200 based on the image by wavelength. The EUV collector inspection apparatus 100 according to the example embodiment may include a light source 110, a camera 120, a band-pass (BP) filter 130, and a stage 140, as illustrated in FIG. 1.

The light source 110 may be spherical and may be apart from a surface of the EUV collector 200 to be inspected. For example, the light source 110 may be arranged at an end of a support rod 115 extending through the EUV collector 200 from the stage 140, and may be spaced apart from the surface of the EUV collector 200. The light source 110 may output light components from an ultraviolet ray (UV) band to a visible light (VIS) band. For example, the light source 110 may be implemented by a broadband light source outputting the light components from the UV band to the VIS band. However, the light source 110 is not limited to the broadband light source. For example, the light source 110 may include at least two light sources outputting light components of different bands from the UV band to the VIS band. For example, in a process of inspecting the EUV collector 200, a plurality of light sources outputting light components of different bands from the UV band to the VIS band may be exchanged and used. On the other hand, the light source 110 may have various shapes. The shape of the light source 110 will be described in more detail with reference to description of the EUV collector inspection apparatus 100a of FIG. 14.

The camera 120 may be a high-sensitivity camera capable of forming an image to correspond to a wavelength band of the light source 110. For example, the camera 120 may form images for the light components from the UV band to the VIS band. A common camera may form an image only for light of the VIS band and may not form an image for light of the UV band. However, in the EUV collector inspection apparatus 100 according to the example embodiment, the camera 120 may form an image not only for the light of the VIS band but also for the light of the UV band to correspond to the wavelength band of the light source 110. Therefore, the EUV collector inspection apparatus 100 according to the example embodiment may measure the contamination of the surface of the EUV collector 200 with high sensitivity. On the other hand, the camera 120 may be arranged considering a position of a focus of the EUV collector 200. However, a position of the camera 120 is not dependent on the position of the focus of the EUV collector 200.

For reference, resolution for detecting micro contamination may increase as a wavelength of light used for inspection is shorter. In addition, in a measurement result of the contaminated EUV collector, sensitivity of an image increases more in the UV band than in the VIS band and may increase as the wavelength is shorter. When the resolution is described with concept of a radius r of an Airy disc, $r=1.22\lambda \cdot f/\#$, wherein $\lambda$ represents a wavelength of used light and f/# means an iris value or an F value. Therefore, when f/# is constant, as the wavelength of the used light is shorter, the radius r of the Airy disc is reduced so that a size of the minimum spot that may be distinguished may be reduced. The sensitivity of the image in accordance with the wavelength will be described in more detail with reference to FIGS. 4 and 5.

The BP filter 130 may be an optical device transmitting set narrowband light. For example, the BP filter 130 may transmit only the narrowband light set in wideband light reflected from the EUV collector 200. Therefore, the camera 120 may form an image for the narrowband light passing through the BP filter 130. On the other hand, in order to form images for most light components from the UV band to the VIS band, a plurality of BP filters 130 may be used. For example, as the plurality of BP filters 130 transmitting the narrowband light from the UV band to the VIS band are exchanged and used, the camera 120 may capture an image for the EUV collector 200 by performing imaging for the most light components from the UV band to the VIS band.

On the other hand, the BP filter 130 may be used when the light source 110 is implemented by a plurality of light sources outputting light components of different bands as well as when the light source 110 is implemented by a wideband light source. For example, widths of the bands of the light components output by the plurality of light sources may be greater than a narrowband that is a pass band of the BP filter 130. Therefore, parts of the bands of the light components output by the plurality of light sources may pass through the BP filter 130.

The stage 140 may support and fix the EUV collector 200 to be inspected. For example, the EUV collector 200 may be arranged on an upper surface of the stage 140 and the stage 140 may support and fix a lower surface of the EUV collector 200. The EUV collector 200 may be an elliptical mirror so that a groove corresponding to the elliptical mirror that may accommodate the EUV collector 200 may be formed in the upper surface of the stage 140. A wiring line or optical fiber connected to the light source 110 through the support rod 115 may be arranged in the stage 140. Electricity or light may be transmitted to the light source 110 through the wiring line or optical fiber. When electricity is applied, light may be generated by the light source 110 and may be output from the light source 110.

On the other hand, the stage 140 may be a three-dimensional moving stage. As the stage 140 moves, the EUV collector 200 may move together. For example, through the movement of the stage 140, focusing on a z axis and/or movement on an x-y plane of the EUV collector 200 may be performed. Here, the z axis may correspond to a normal line perpendicular to a horizontal plane of the stage 140 or a plane contacting the central portion of the EUV collector 200, and the x-y plane may correspond to the horizontal plane of the stage 140 or a plane perpendicular to the z axis.

Although not illustrated, the EUV collector inspection apparatus 100 may further include a controller. The controller may calculate EUV reflectance of the EUV collector 200 based on the image by wavelength. The controller can include one or more of the following components: at least one central processing unit (CPU) configured to execute computer program instructions to perform various processes and methods (e.g., the operations of FIGS. 16 and 17), random access memory (RAM) and read only memory (ROM) configured to access and store data and information and computer program instructions, input/output (I/O) devices configured to provide input and/or output to the controller (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium) where data and/or instructions can be stored. In addition, the controller can include antennas, network interfaces that provide wireless and/or wire line digital and/or analog interface to one or more networks over one or more network connections (not shown), a power source that provides an appropriate alternating current (AC) or direct current (DC) to power one or more components of the controller, and a bus that allows communication among the various disclosed components of the controller.

For reference, referring to FIG. 2, a structure and operation of an EUV generating apparatus 1000 or EUV equipment including the EUV collector 200 will be simply described as follows. Here, the EUV generating apparatus 1000 means only a portion generating EUV light and the EUV equipment may mean EUV exposure equipment including the EUV generating apparatus 1000 as the EUV light source.

The EUV generating apparatus 1000 may convert a material including at least one element, for example, xenon (Xe), lithium (Li), or tin (Sn), to plasma having one or more emission lines. The EUV generating apparatus 1000 may be, for example, an EUV generating apparatus of a laser produced plasma (LPP) method using a laser and may include the EUV collector 200 for focusing the EUV light. In the EUV generating apparatus 1000 of the LPP method, an Sn droplet Dp may be provided to a chamber in which the EUV collector 200 is arranged. In addition, a high-output carbon dioxide ($CO_2$) laser L is focused on and irradiated onto the Sn droplet Dp so that Sn plasma is generated and the EUV light may be generated by Sn plasma.

On the other hand, as illustrated in FIG. 2, the Sn droplet Dp passes a primary focus (PF) of the EUV collector 200 and the $CO_2$ laser L is irradiated onto the PF so that plasma may be generated at the PF. In addition, the EUV light generated by plasma may spread in all directions from the PF. The EUV light may be reflected from the EUV collector 200 and may be focused on an intermediate focus (IF). A principle in which the EUV light is focused by the EUV collector 200 is in accordance with the law of reflection of the elliptical mirror. For example, light emitted from one focus of the elliptical mirror is reflected from the elliptical mirror and travels to another focus of the elliptical mirror. Therefore, the EUV light emitted from the PF may be reflected from the elliptical mirror and may travel to and be focused on the IF. The EUV light focused on the IF may be output to a scanner of the EUV equipment. Therefore, the EUV generating apparatus 1000 may be used as a light source of the EUV equipment.

In the EUV generating apparatus 1000, the EUV collector 200 may be commonly adjacent to the Sn droplet Dp. For example, the EUV collector 200 may be commonly adjacent to the Sn droplet Dp so that the Sn droplet Dp may pass the PF of the EUV collector 200. Therefore, while the Sn droplet Dp is vaporized or plasmaized, various byproducts are generated so that a surface of the EUV collector 200 may be contaminated by the various byproducts or plasma. Here, that the surface of the EUV collector 200 is contaminated may mean that the various byproducts are deposited on the surface of the EUV collector 200 or the surface of the EUV collector 200 is damaged by plasma. For example, Sn may be deposited on the surface of the EUV collector 200 or a capping layer or a molybdenum (Mo)/silicon (Si) multilayer of the EUV collector 200 may be contaminated. The contamination of the EUV collector 200 will be described in more detail with reference to FIGS. 6 to 11B.

On the other hand, when the surface of the EUV collector 200 is contaminated, the EUV reflectance of the EUV collector 200 may be reduced. For example, as noted from the graph of FIG. 3, the EUV reflectance of the EUV collector 200 may be gradually reduced over time. In FIG. 3, the graph illustrates the EUV reflectance of the EUV collector 200 over time. Time of an x axis may represent an arbitrary unit and reflectance of a y axis may represent relative reflectance. For example, the EUV reflectance is determined as 100% at start time 0, and relative reflectance with respect to the EUV reflectance over time is illustrated.

When the EUV reflectance of the EUV collector 200 is reduced, an amount of the EUV light output to the scanner of the EUV equipment is reduced and, as a result, productivity of the EUV equipment may deteriorate. More specifically, in an EUV exposure process, an EUV dose may vary in accordance with a depth of a patterned trench and, in general, as the depth of the patterned trench increases, a higher dose may be required. For example, when a threshold dose used for patterning the trench is about 65 mJ, a dose of no less than 200 mJ may be required in accordance with the depth of the patterned trench. However, when the EUV reflectance of the EUV collector 200 is reduced, the amount of the EUV light output to the scanner of the EUV equipment is reduced so that a required EUV dose may not be satisfied. As a result, the EUV exposure process and the productivity of the EUV equipment may deteriorate.

Therefore, in the EUV equipment, the EUV collector 200 is regularly/irregularly exchanged. In addition, after the contaminated EUV collector 200 exchanged from the EUV equipment is washed, the EUV reflectance may be inspected by using the inspection apparatus. After being washed, the EUV collector 200 undergoing the inspection is remounted in the EUV equipment and is used.

The EUV collector inspection apparatus 100 according to an example embodiment includes the light source 110 outputting the light components from the UV band to the VIS band and the camera 120 with high sensitivity capable of focusing images in such bands, and may precisely inspect the contamination of the surface of the EUV collector 200 and the EUV reflectance of the EUV collector 200. In addition, based on the precise inspection, a cause of the contamination may be analyzed and life expectancy of the EUV collector 200 may be calculated. The analysis of the cause of the contamination and calculation of the life expectancy of the EUV collector 200 may be performed by the controller discussed above in connection with FIG. 1. As a result, the EUV collector inspection apparatus 100 according to the example embodiment may effectively solve the problem of reduction in an operating rate and productivity of the EUV equipment, which occurs due to initial quality defect when the EUV collector 200 is exchanged, in comparison with an inspection apparatus using a single imaging processing method based on a light source of the VIS band.

Furthermore, the EUV collector inspection apparatus 100 according to the example embodiment may inspect the contamination of the surface of the EUV collector 200 and the EUV reflectance of the EUV collector 200 more precisely by obtaining image by wavelength from the UV band to the VIS band through the camera 120 by using the optical device such as the BP filter 130 and obtaining reflectance in accordance with a wavelength of the EUV collector 200 based on the image by wavelength. For example, the EUV reflectance of the EUV collector 200 may be calculated based on the contaminated area of the EUV collector 200 by calculating a contaminated area of the EUV collector 200 based on the image by wavelength, or the EUV reflectance of the EUV collector 200 may be calculated through statistical data analysis by creating a contamination model based on the image by wavelength. Calculation of the EUV reflectance of the EUV collector 200 will be described in more detail with reference to FIGS. 12 and 13. The creation of the contamination model and/or the calculation of the EUV reflectance of the EUV collector 200 may be performed by the controller discussed above in connection with FIG. 1.

Furthermore, in relation to the EUV reflectance, the EUV band may mainly mean a narrowband of 13 nm to 14 nm using 13.5 nm as a central wavelength. However, the EUV band is not limited to the above-described numerical values. For example, the EUV band may include a wider wavelength range of 4 nm to 124 nm. In addition, the EUV band may include a wavelength range of less than 11 nm. For example, the EUV band may include a narrowband of 5 nm to 10 nm or 5 nm to 8 nm, or a narrowband of 6.5 nm to 6.9 nm referred to as a '6.x' wavelength range.

Figure 4:
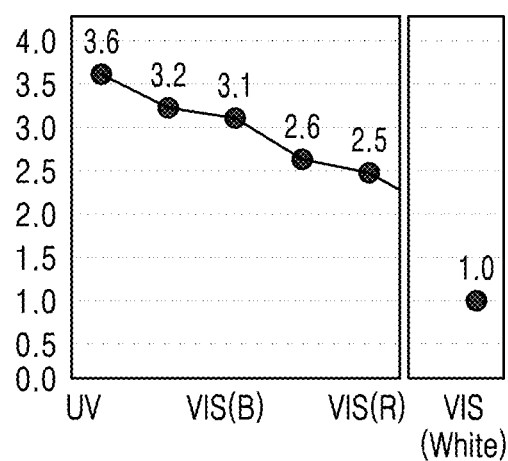
FIG. 4 is a graph illustrating intensity ranges in accordance with wavelengths for an EUV collector.
Figure 5:
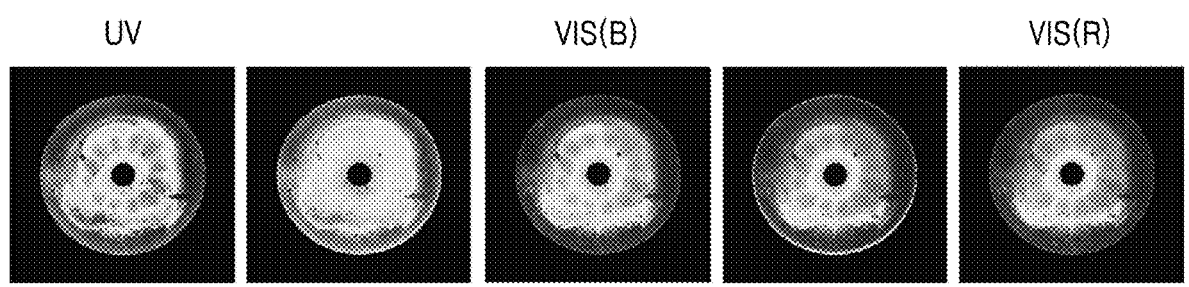
FIG. 5 are photographs illustrating images in accordance with wavelengths for an EUV collector.

FIG. 4 is a graph illustrating intensity ranges in accordance with wavelengths for an EUV collector, and FIG. 5 are photographs illustrating images in accordance with wavelengths for an EUV collector. Description will be given with reference to FIG. 1 together and description previously given with reference to FIGS. 1 to 3 will be briefly described or omitted.

Referring to FIG. 4, the graph of FIG. 4 illustrates intensity ranges measured for the washed EUV collector 200, in which an x axis represents specific wavelengths and a y axis represents intensity ranges. In addition, in the x axis, VIS(B) may mean blue series in the VIS band and VIS(R) may mean red series in the VIS band. Here, the intensity range as a concept for contrast corresponds to a value obtained by subtracting the minimum intensity from the maximum intensity and is expressed as a relative value based on white light of the right box. On the other hand, the intensity ranges of the graph in the left box are measured by using the light source 110 from the UV band to the VIS band and the camera 120 with high sensitivity, which corresponds to the light source 110, in the EUV collector inspection apparatus 100 according to the example embodiment and the intensity range in the right box is measured by using a light source of the VIS band and a commercial camera.

It is noted from the graph of FIG. 4 that the intensity ranges of the graph in the left box are higher than the intensity range in the right box. In addition, it is noted that, as the wavelength is shorter, the intensity range is higher. Based on such a result of the intensity range, it may be predicted that, when light of a wavelength shorter than that of the VIS band or the light of the UV band is used, the contamination of the EUV collector 200 may be sensitively detected.

Referring to FIG. 5, the photographs of FIG. 5 are images captured by using the light source 110 from the UV band to the VIS band, the camera 120 with high sensitivity, which corresponds to the light source 110, and the BP filter 130 in the EUV collector inspection apparatus 100. On the other hand, the respective photographs may correspond to wavelengths gradually increasing from the UV band to the VIS(R) band. On the other hand, a width of a narrowband passing through the BP filter 130 may be no more than 10 nm. However, the width of the narrowband passing through the BP filter 130 is not limited to the above-described numerical values.

It may be noted from FIG. 5 that, in images corresponding to a short wavelength band, intensity distribution is more complicated. As a result, it may be predicted that the contamination of the EUV collector 200 may be detected more clearly by using light of a short wavelength band and may be detected by region.

Figure 6:
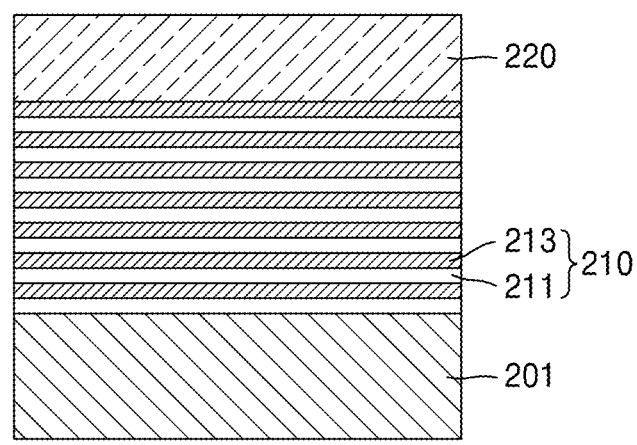
FIG. 6 is a cross-sectional view illustrating a cross-section of an EUV collector to be inspected.

FIG. 6 is a cross-sectional view illustrating a cross-section of an EUV collector 200 to be inspected.

Referring to FIG. 6, the EUV collector 200 may include a substrate 201, an Mo/Si multilayer 210, and a capping layer 220. The substrate 201 may include a low thermal expansion material (LTEM). For example, the substrate 201 may include silicon (Si) or quartz. A material of the substrate 201 is not limited to the above material.

The Mo/Si multilayer 210 formed on the substrate 201 may include a plurality of silicon (Si) layers 211 and a plurality of molybdenum (Mo) layers 213 alternatively stacked in order to maximize EUV reflection. For example, the Mo/Si multilayer 210 may be obtained by stacking about 40 to about 60 bilayers, each bilayer including an Si layer 211 and an Mo layer 213. The number of stacked bilayers is not limited to the above numerical values.

The capping layer 220 may be formed on the Mo/Si multilayer 210. The capping layer 220 may include at least one material layer and may protect the Mo/Si multilayer 210. For example, the capping layer 220 may be formed of a ruthenium (Ru) or an oxide-based membrane to a thickness of several to dozens of nm. For example, the capping layer 220 may have a thickness in a range from about 3 nm to about 36 nm. However, a material of the capping layer 220 is not limited to the Ru or oxide-based membrane. In addition, the thickness of the capping layer 220 is not limited to the above numerical values.

On the other hand, a structure of the EUV collector 200 is not limited to that of FIG. 6. In addition, materials of the respective layers forming the EUV collector 200 are not limited to the above materials. For example, the EUV collector 200 may have various structures and may be formed of various materials to maximize the EUV reflection. In addition, because the EUV collector 200 must reflect the EUV light in a plasma environment, the EUV collector 200 may be formed of a material capable of minimizing damage caused by plasma.

As described above, in the EUV generating apparatus or the EUV equipment, the contamination of the EUV collector 200 may be divided as follows. In one case, a plasma byproduct, for example, tin (Sn) is deposited on the capping layer 220. In another case, the capping layer 220 and/or the Mo/Si multilayer 210 are/is damaged by plasma. In the above two cases, the EUV reflectance of the EUV collector 200 may be affected.

Figure 7:
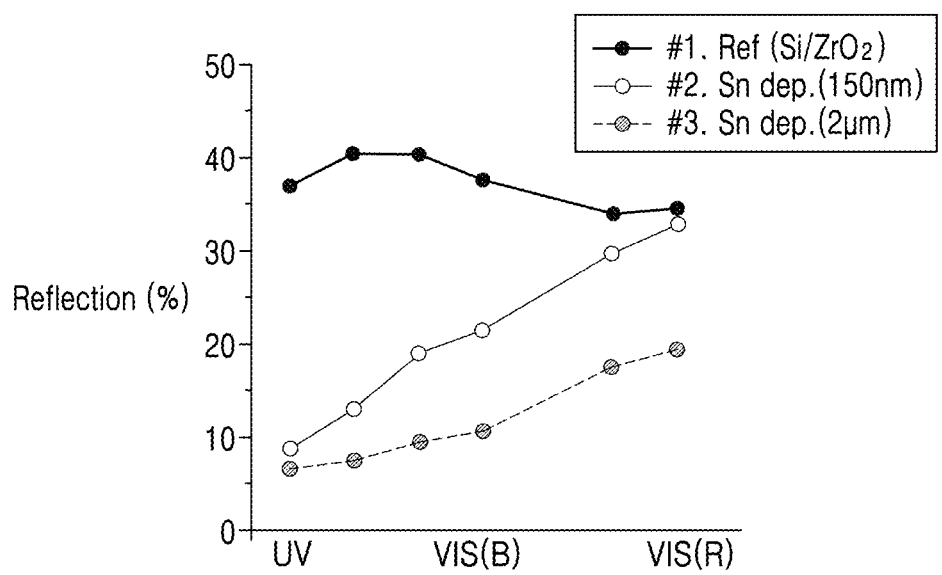
FIG. 7 is a graph illustrating a reflectance measurement result of a specimen on which tin (Sn) is deposited.

FIG. 7 is a graph illustrating a reflectance measurement result of a specimen on which Sn is deposited. Here, the specimen is a test sample corresponding to the EUV collector 200. A reference specimen #1 may include an Si/$ZrO_2$ layer in the uppermost layer and first and second comparative specimens #2 and #3 may respectively include Sn layers to thicknesses of 150 nm and 2 μm on the Si/$ZrO_2$ layer.

Referring to FIG. 7, it may be noted that reflectance of the reference specimen #1 is maintained to be constant to some degree in all wavelength bands. On the other hand, it may be noted that reflectance of each of the first and second comparative specimens #2 and #3 on which Sn is deposited is rapidly reduced as a wavelength is shorter. It may be predicted by such a result that detection power for Sn contamination or an Sn contaminated area may remarkably increase when the light of the UV band is used. For example, in the first comparative specimen #2, when a portion with reflectance of no more than 20% is determined as being contaminated or as a contaminated region, if the light of the VIS band is used, it may be determined that the first comparative specimen #2 is not contaminated or the contaminated region does not exist. On the other hand, if the light of the UV band is used, it may be determined that the first comparative specimen #2 is contaminated or the contaminated region exists.

Figure 8:
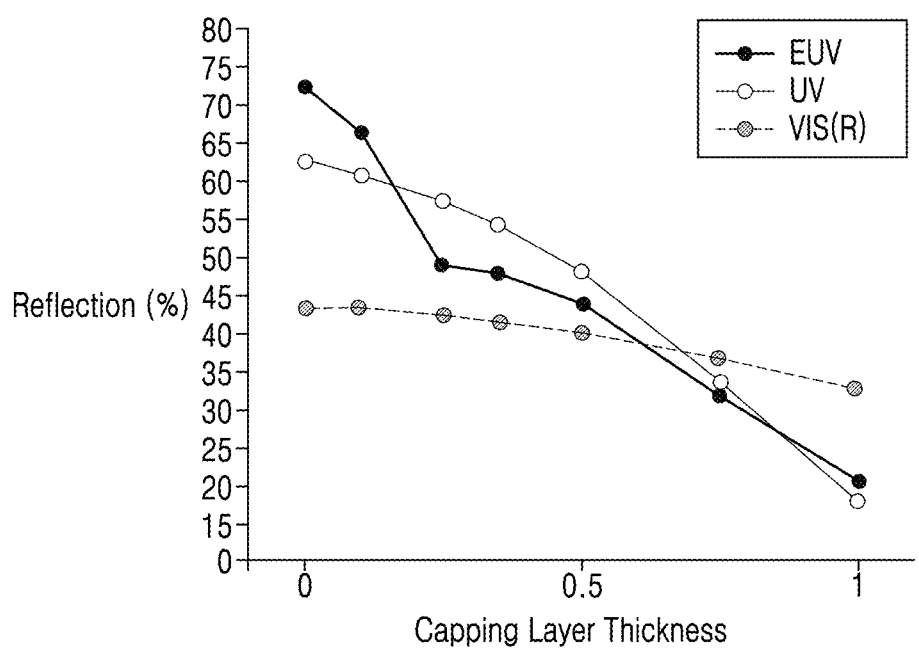
FIG. 8 is a simulation graph illustrating tendency of a change in reflectance of each of EUV, ultraviolet (UV), and visible (VIS)(R) in accordance with damage of a capping layer in an EUV collector.
Figure 9:
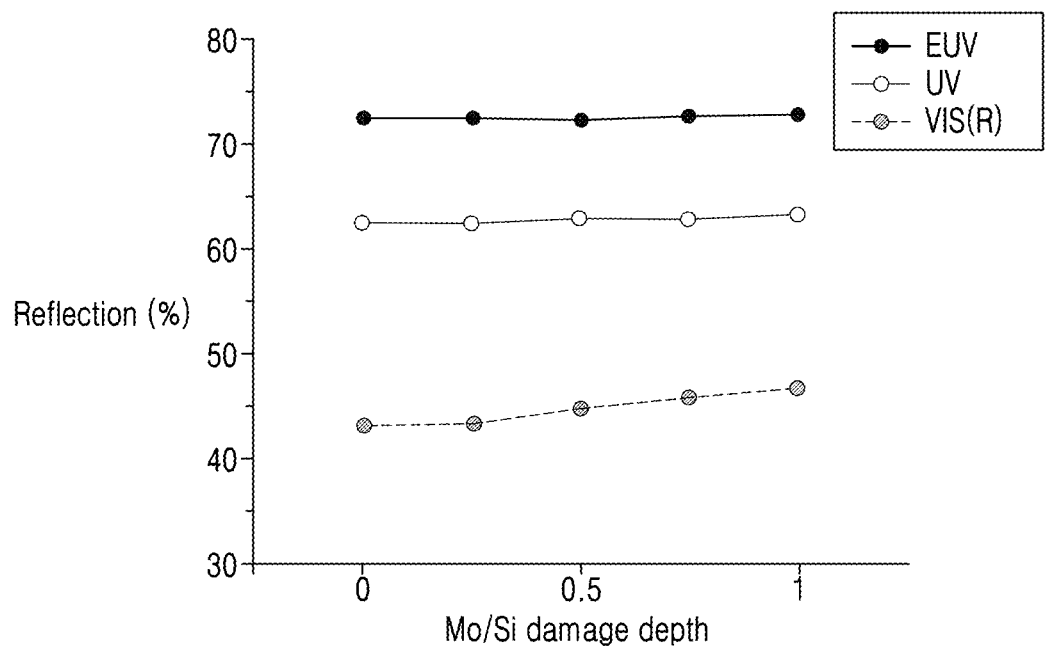
FIG. 9 is a simulation graph illustrating tendency of a change in reflectance of each of EUV, UV, and VIS(R) in accordance with damage of a molybdenum (Mo)/silicon (Si) multilayer in an EUV collector.

FIG. 8 is a simulation graph illustrating tendency of a change in reflectance of each of EUV, UV, and VIS(R) in accordance with damage of a capping layer in an EUV collector, and FIG. 9 is a simulation graph illustrating tendency of a change in reflectance of each of EUV, UV, and VIS(R) in accordance with damage of a molybdenum (Mo)/silicon (Si) multilayer in an EUV collector. In FIG. 8, an x axis represents a thickness of a capping layer left after being damaged. In FIG. 9, an x axis represents a thickness of an Mo/Si multilayer removed after being damaged. Both of the thicknesses may be represented by arbitrary units. Description will be given in combination with reference to FIG. 6.

Referring to FIG. 8, in the EUV collector 200, the EUV reflection is performed by the Mo/Si multilayer 210, and the capping layer 220 protects the Mo/Si multilayer 210 rather than performing the EUV reflection. Therefore, when the Mo/Si multilayer 210 is intact, the EUV reflectance of the EUV collector 200 may be greater when the capping layer 220 is not provided than when the capping layer 220 is provided. In addition, when the capping layer 220 is provided, the EUV reflectance of the EUV collector 200 may increase as the capping layer 220 is reduced. For example, as the capping layer 220 is removed more, the EUV reflectance of the EUV collector 200 may increase. Such a result may be obtained through the graph of FIG. 8. The graph of FIG. 8 illustrates reflectance when the capping layer 220 has a thickness of 0 nm to dozens of nm.

On the other hand, because the Mo/Si multilayer 210 mainly reflects the EUV light, in each thickness, reflectance is maximal in the central wavelength of the EUV band, for example, 13.5 nm, and may be rapidly reduced in ±0.5 nm around 13.5 nm.

From the UV band to the VIS band, reflectance in accordance with the thickness of the capping layer 220 changes depending on a wavelength in similar tendency. For example, the reflectance of the EUV collector 200 is maximal in a specific wavelength in the UV band and, as noted from the graph of FIG. 8, as the thickness of the capping layer 220 increases, the reflectance of the EUV collector 200 may be reduced.

When a wavelength band is no more or less than the specific wavelength in the UV band, the reflectance of the EUV collector 200 may be gradually reduced. On the other hand, as noted from the graph of FIG. 8, when a wavelength of light is VIS(R) or near infrared ray (NIR), regardless of the thickness of the capping layer 220, the reflectance of the EUV collector 200 may be maintained to be almost the same.

Referring to FIG. 9, the graph of FIG. 9 illustrates reflectance when the Mo/Si multilayer 210, for example, the Si layer 211 is removed by a thickness of 0 nm to several nm. A case in which the Mo/Si multilayer 210 is removed by a thickness of 0 nm may correspond to a case in which the Mo/Si multilayer 210 is not damaged. On the other hand, in each thickness, the capping layer 220 may not be provided.

As noted from the graph of FIG. 9, regardless of a removed thickness of the Mo/Si multilayer 210, the EUV reflectance may be maintained to be the same. In addition, reflectance in accordance with a wavelength in each thickness is maximal in the central wavelength of the EUV band, for example, 13.5 nm, and may be rapidly reduced in ±0.5 nm around 13.5 nm.

In the UV band, regardless of a removed thickness of the Mo/Si multilayer 210, the EUV reflectance may be maintained to be the same. In addition, reflectance in accordance with a wavelength in each thickness is maximal in a specific wavelength in the UV band and is reduced in a wavelength of no more or less than the specific wavelength.

On the other hand, in the VIS band, as noted from the graph of FIG. 9, reflectance slightly increases as the removed thickness of the Mo/Si multilayer 210 increases. In addition, reflectance in accordance with a wavelength in each thickness is gradually reduced in accordance with increase in wavelength in the VIS(R) band and increases in the NIR band in similar tendency.

It may be noted from the simulation results of FIGS. 8 and 9 that changes in reflectance in accordance with wavelengths in each thickness when the capping layer 220 is damaged may have the same tendency. However, as noted from the graph of FIG. 8, tendency of a change in reflectance in accordance with a thickness of the capping layer 220 in each of EUV, UV, and VIS(R) may vary. Therefore, when reflectance information items of various wavelength bands are combined, a contamination degree and EUV reflectance for corresponding contamination may be estimated. On the other hand, changes in EUV light and UV reflectance when the Mo/Si multilayer 210 is damaged have almost the same tendency. However, changes in reflectance in the VIS band have different tendencies. Therefore, when physical contamination modeling is established and a difference in tendency of changes in reflectance by wavelength in accordance with a contamination mode and the physical contamination modeling are analyzed, the contamination mode in the surface of the EUV collector 200 may be found out. Here, the contamination mode may include a state and/or kind of contamination by region of the surface of the EUV collector 200. In addition, by analyzing the contamination mode and the contamination rate (the degree of contamination), the EUV reflectance of the EUV collector 200 may be calculated with higher coherence and, by analyzing a cause of contamination, the life expectancy of the EUV collector 200 may be calculated.

Figure 10A:
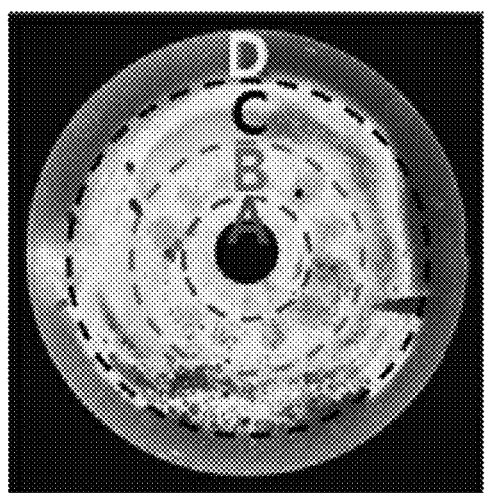
FIGS. 10A and 10B are, respectively, a photograph illustrating contamination by region of an EUV collector and a graph illustrating intensity in accordance with a wavelength, which corresponds to the contamination by region.
Figure 10B:
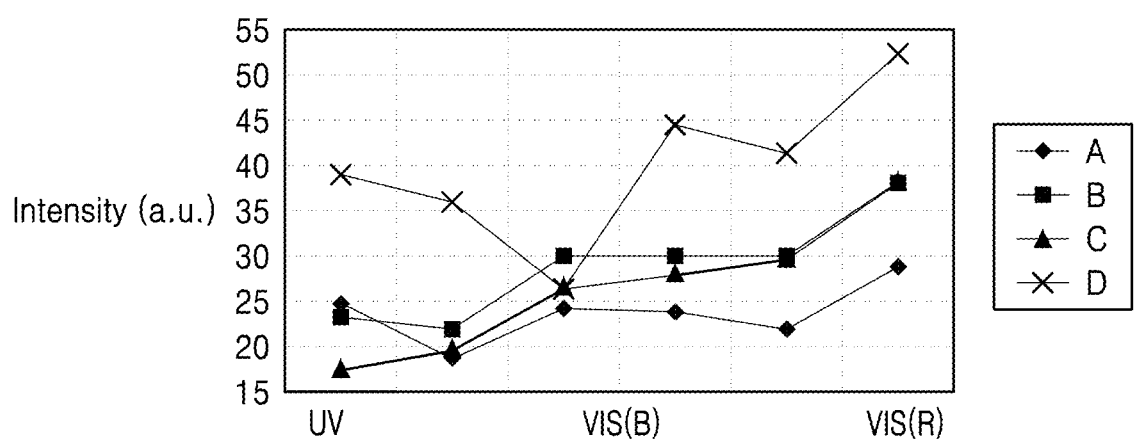

FIG. 10A is a photograph illustrating contamination by region of an EUV collector and FIG. 10B is a graph illustrating intensity in accordance with a wavelength, which corresponds to the contamination by region. In the graph of FIG. 10B, an x axis represents a wavelength from the UV band to the VIS band and a y axis represents intensity of reflected light in a corresponding wavelength. Both of the wavelength and the intensity may be represented by arbitrary units.

Referring to FIGS. 10A and 10B, the EUV collector 200 may be divided by region. For example, as illustrated in FIG. 10A, the EUV collector 200 may be divided from a region A to a region D in accordance with a radius. However, division of the EUV collector 200 is not limited to division in accordance with the radius and may be performed on various references or in various forms. For example, the EUV collector 200 may be divided by region in accordance with a central angle. In addition, the number of regions of the EUV collector 200 is not limited to 4. For example, the EUV collector 200 may be divided into 2, 3, or 5 or more regions.

As noted from the graph of FIG. 10B, in the regions divided in accordance with the radius, graphs of intensities in accordance with wavelengths may be different from one another. Therefore, through a graph in accordance with wavelength by region, a degree of contamination or a contamination rate in each region may be grasped. The degree of contamination may vary in accordance with, for example, a kind or a thickness of a contamination source. In addition, the degree of contamination may vary in accordance with a degree of damage of each of layers forming the EUV collector 200.

Based on the graph of intensity in accordance with the wavelength by region, a cause of contamination may be predicted or analyzed. For example, the cause of contamination may be grasped by precisely analyzing corresponding regions of the EUV collector 200, may be matched with the graph of intensity in accordance with the wavelength by region, and may be stored in a database. Then, by obtaining the graph of intensity in accordance with the wavelength by region and finding out the cause of contamination corresponding to the graph of intensity obtained in the database, causes of contamination of corresponding regions may be predicted or analyzed.

Figure 11A:
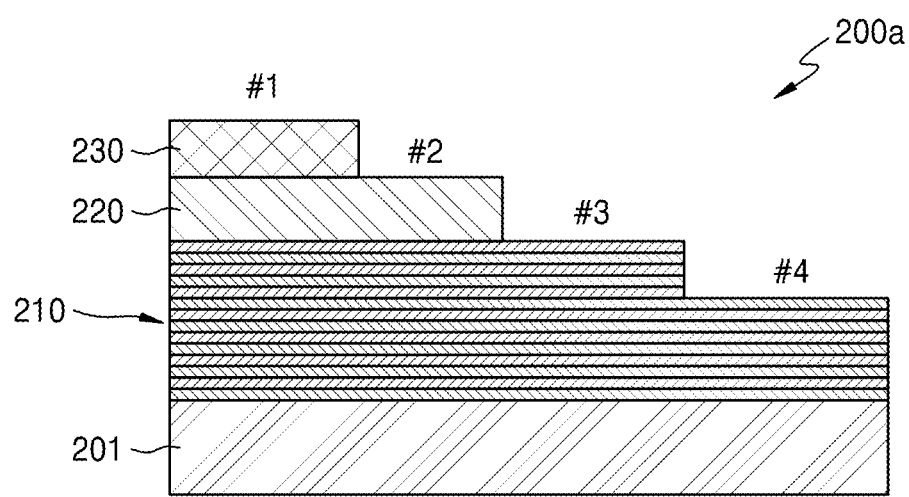
FIGS. 11A and 11B are, respectively, a cross-sectional view illustrating layers of an EUV collector including an Sn layer and an example graph illustrating reflectance in accordance with a wavelength from an UV band to a VIS band in each of the layers.
Figure 11B:
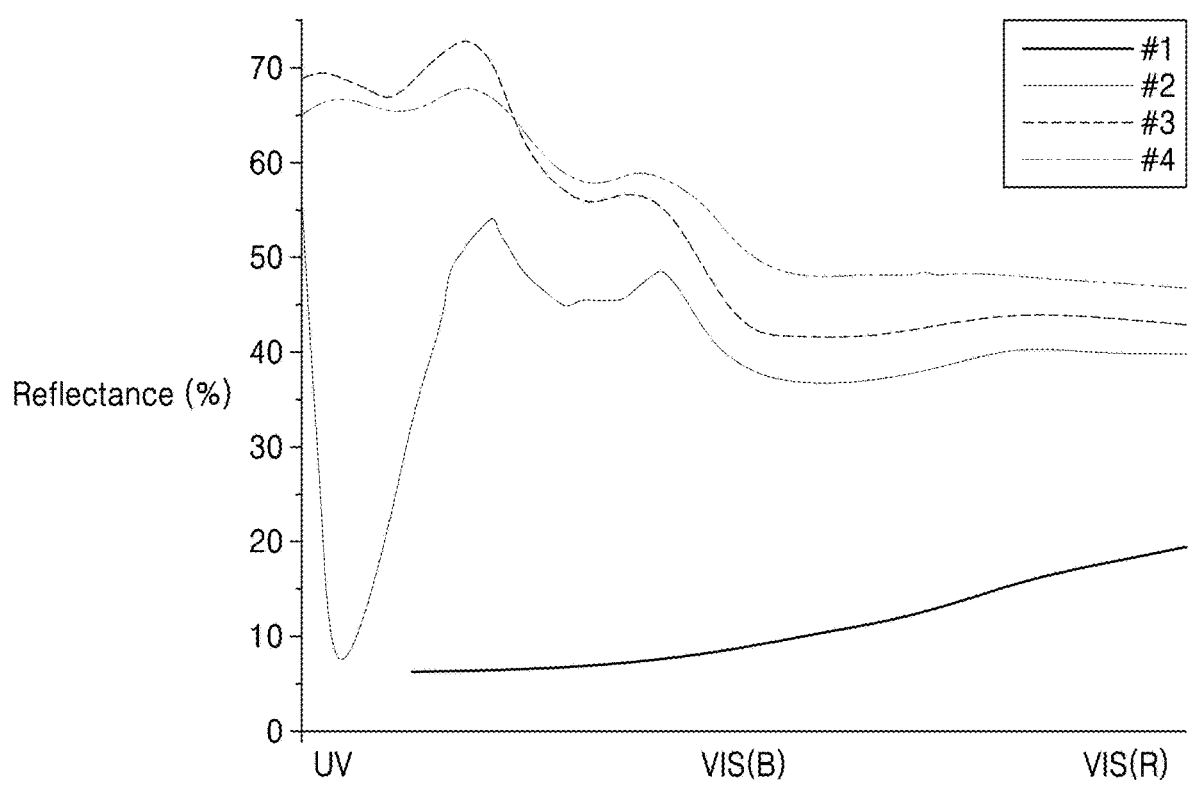
Figure 12:
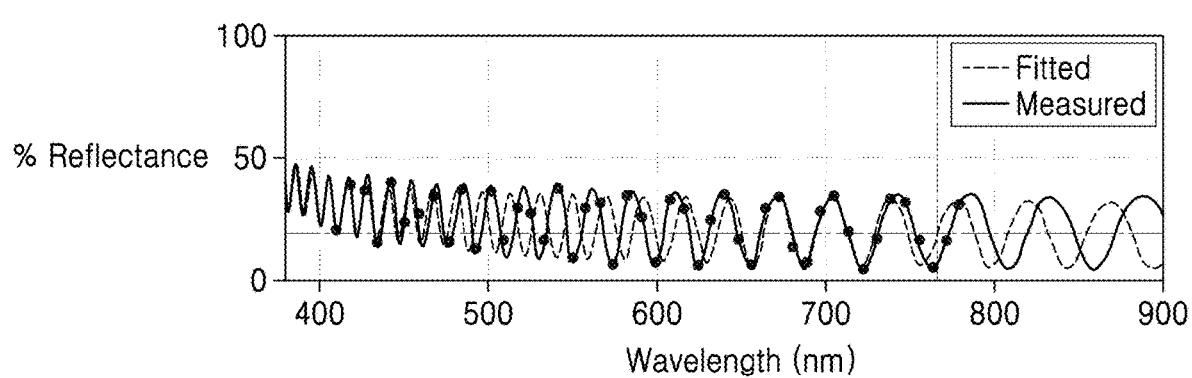
FIG. 12 is a graph indirectly illustrating contamination modeling and a method of estimating a contamination amount based on reflectance in accordance with a wavelength.

FIG. 11A is a cross-sectional view illustrating layers of an EUV collector 200a including an Sn layer 230, FIG. 11B is an exemplary graph illustrating reflectance in accordance with a wavelength from an UV band to a VIS band in each of the layers, and FIG. 12 is a graph indirectly illustrating contamination modeling and a method of estimating a contamination amount based on reflectance in accordance with a wavelength.

Referring to FIGS. 11A and 11B, #1 illustrates reflectance in accordance with a wavelength in a state in which the Sn layer 230 is deposited on the capping layer 220 of the EUV collector 200a, and #2 illustrates reflectance in accordance with a wavelength in a state in which the Sn layer 230 is not provided on the capping layer 220 of the EUV collector 200a. #2 may correspond to reflectance in accordance with a wavelength in a state in which the EUV collector 200a is not contaminated by Sn.

In addition, #3 illustrates reflectance in accordance with a wavelength in a state in which the capping layer 220 is not provided in the EUV collector 200a and the Mo/Si multi-layer 210 is not damaged, and #4 illustrates reflectance in accordance with a wavelength in a state in which the capping layer 220 is not provided in the EUV collector 200a and an upper layer of the Mo/Si multilayer 210 is partially removed.

As noted from the graph of FIG. 11B, in accordance with each state of the EUV collector 200a, the graph of reflectance in accordance with a wavelength may vary. Therefore, by obtaining the graph of the reflectance in accordance with the wavelength for the EUV collector 200a, a state, for example, a contamination state of the EUV collector 200a, may be predicted.

Referring to FIG. 12, when reflectance in accordance with a wavelength for a specific contamination state is measured, the graph of FIG. 12 may be obtained. In the graph of FIG. 12, a solid line may represent reflectance measured in accordance with a wavelength and a dotted line may represent reflectance in accordance with a wavelength fitted through modeling. The measured reflectance graph may be stored in the database as a reference reflectance graph. By comparing the fitted reflectance graph with the reference reflectance graph stored in the database, the contamination state may be predicted. For example, when the fitted reflectance graph coincides with the reference reflectance graph corresponding to contamination with a kind of contamination A and a thickness B, the corresponding contamination may be predicted as contamination with a kind A and a thickness B so that information on the kind and thickness of the corresponding contamination may be obtained.

Such a method may also be applied to a method of obtaining the reflectance graph in accordance with the wavelength for the EUV collector 200, performing contamination modeling and estimating the contamination amount of the EUV collector 200. For example, for various states of the EUV collector 200, graphs of reflectance in accordance with wavelengths are obtained beyond count and are stored in the database and each of the states of the EUV collector 200 may be quantified or contamination modeled by the graph of the reflectance in accordance with the wavelength. Therefore, by obtaining the graph of the reflectance in accordance with the wavelength for the EUV collector 200 and comparing the obtained reflectance graph with the quantified graph or performing contamination modeling, the contamination state of the corresponding EUV collector 200 may be predicted.

Figure 13:
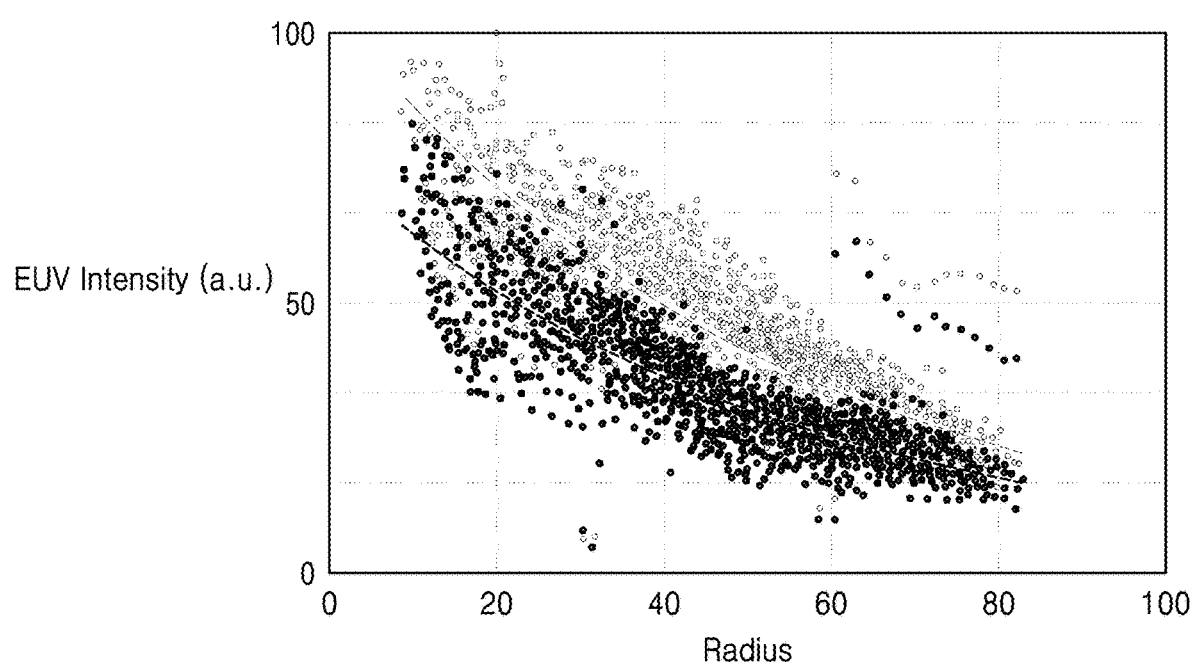
FIG. 13 is a graph illustrating a method of improving coherence of EUV reflectance through statistical data analysis.

FIG. 13 is a graph illustrating a method of improving coherence of EUV reflectance through statistical data analysis. An x axis represents a radius of the EUV collector 200 and a y axis represents intensity of EUV reflected light. Both of the radius and the intensity may be arbitrary units.

Referring to FIG. 13, for the EUV collector 200, as described above with reference to FIGS. 11A, 11B, and 12, the database may be established for the graph of the reflectance in accordance with the wavelength and the contamination modeling may be created based on the database. Furthermore, by performing the statistical data analysis based on the database, the EUV reflectance of the EUV collector 200 may be calculated. For example, as described above with reference to FIGS. 8 and 9, by combining the reflectance information items of various wavelength bands, the EUV reflectance of the EUV collector 200 corresponding to the corresponding contamination may be predicted or calculated. In addition, in proportion to a magnitude of data stored in the database, the coherence of the EUV reflectance may increase.

FIG. 13 illustrates EUV intensities in accordance with radiuses. White points and a thin dotted line represent measured EUV intensities in accordance with radiuses for the EUV collector 200 and fitting lines corresponding to the measured EUV intensities. In addition, black points and a thick dotted line represent EUV intensities in accordance with radiuses for the EUV collector 200, which are obtained through modeling, and fitting lines corresponding to the EUV intensities. Here, the thin dotted line may operate as a reference graph of the EUV intensity in accordance with the radius and it may be noted that the EUV intensity obtained through modeling and the fitting line corresponding to the EUV intensity are similar to the reference graph. As a result, it may be noted that the coherence of the EUV reflectance may be increased through the statistical data analysis.

In FIG. 13, the EUV reflectance in accordance with the radius is illustrated. However, unlikely, by representing the EUV collector 200 as a two-dimensional circle on an x-y plane and representing the EUV reflectance or the intensity of the EUV reflected light by a color or shadow, an EUV reflectance map for the EUV collector 200 may be created.

Figure 14:
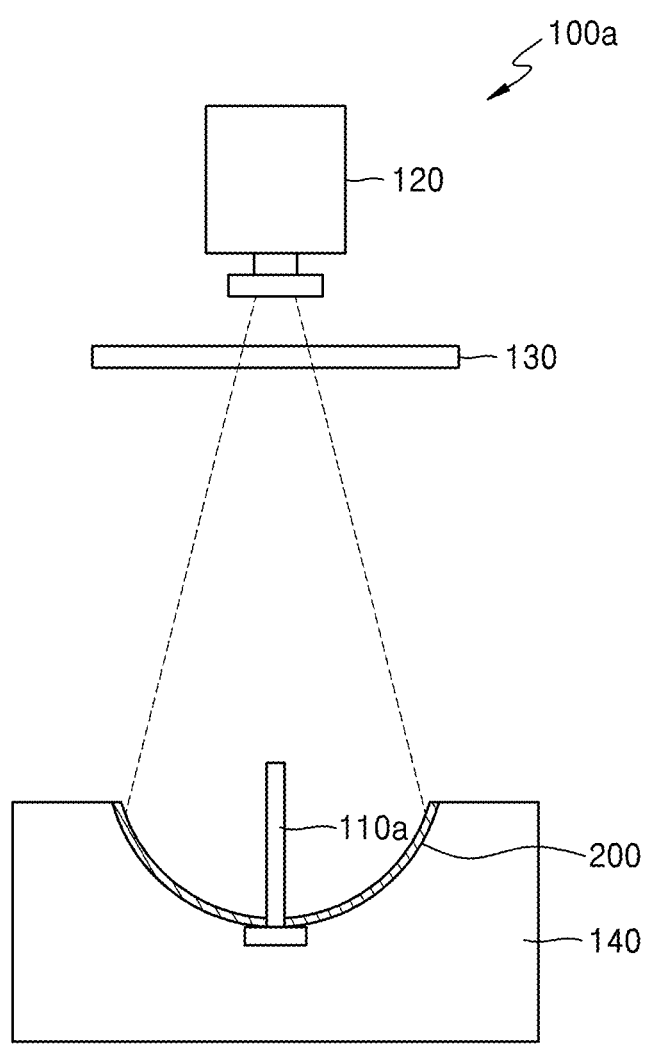
FIG. 14 is a structure diagram schematically illustrating an EUV collector inspection apparatus according to an example embodiment of the inventive concept.

FIG. 14 is a structure diagram schematically illustrating an EUV collector inspection apparatus 100a according to an example embodiment of the inventive concept. Description previously given with reference to FIGS. 1 to 13 will be briefly described or omitted.

Referring to FIG. 14, the EUV collector inspection apparatus 100a according to the example embodiment may be different from the EUV collector inspection apparatus 100 of FIG. 1 in a shape of a light source 110a. Specifically, in the EUV collector inspection apparatus 100a, the light source 110a may be columnar. For example, the light source 110a may be cylindrical column or may be in the form of an elliptical or polygonal column. As illustrated in FIG. 14, the light source 110a may extend from the center of the EUV collector 200 in the form of an elliptical mirror to the camera 120 and may be combined with the EUV collector 200. On the other hand, a lower end of the light source 110a may be combined with the stage 140 and may be connected to a wiring line or optical fiber in the stage 140.

On the other hand, in the EUV collector inspection apparatus according to the example embodiment, the shape of the light source is not limited to a spherical or columnar shape. For example, the light source may have various shapes such as a hemisphere and an elliptical sphere.

Figure 15A:
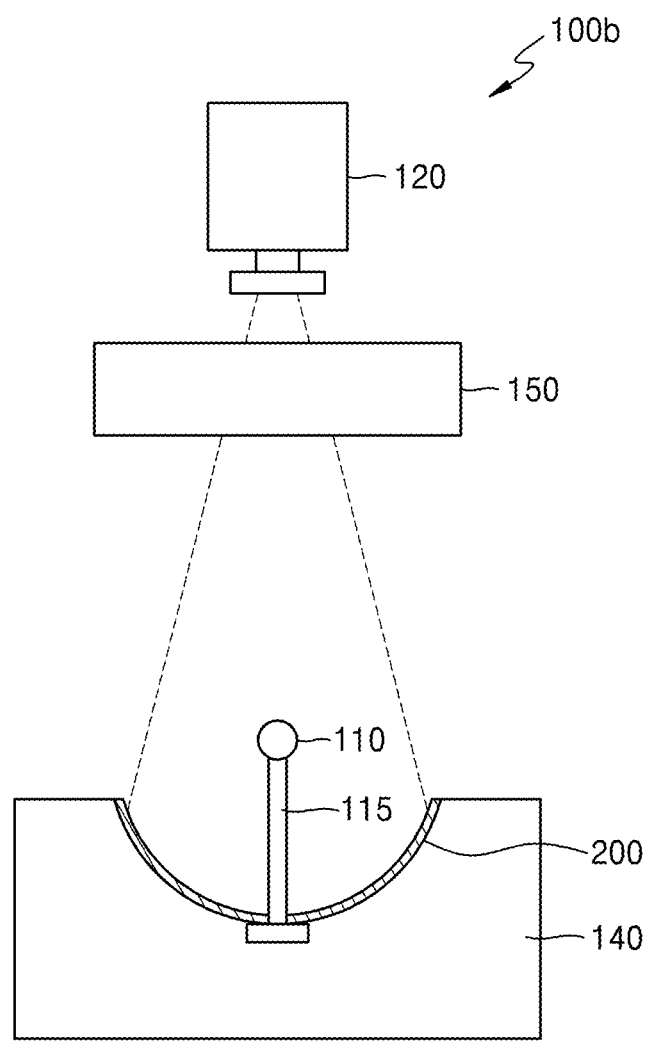
FIGS. 15A and 15B are respectively a structure diagram schematically illustrating an EUV collector inspection apparatus, according to an example embodiment of the inventive concept and a graph illustrating image by wavelength.
Figure 15B:
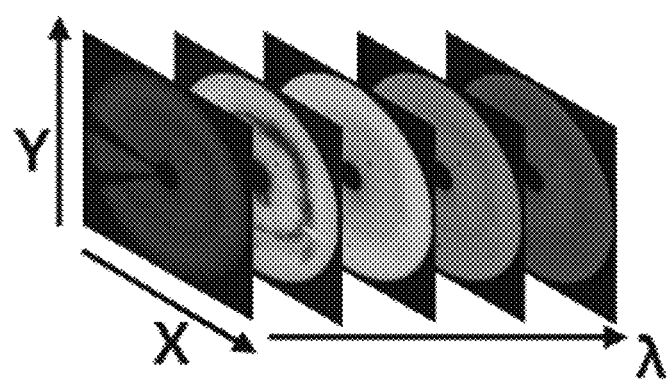

FIG. 15A is a structure diagram schematically illustrating an EUV collector inspection apparatus 100b according to an example embodiment of the inventive concept, and FIG. 15B is a graph illustrating image by wavelength. Description previously given with reference to FIGS. 1 to 13 will be briefly described or omitted.

Referring to FIGS. 15A and 15B, the EUV collector inspection apparatus 100b according to the example embodiment may be different from the EUV collector inspection apparatus 100 of FIG. 1 in that a spectrometer 150 is included instead of the BP filter 130. Specifically, the EUV collector inspection apparatus 100b according to the example embodiment may include the spectrometer 150 dividing light incident toward the camera 120 by wavelength. The spectrometer 150 may be, for example, a monochromator. However, the spectrometer 150 is not limited to the monochromator. For example, the spectrometer 150 may be implemented to have various shapes through a prism or grating.

On the other hand, in the EUV collector inspection apparatus 100b according to the example embodiment, the spectrometer 150 is arranged in front of the camera 120. However, a position of the spectrometer 150 is not limited thereto. For example, the spectrometer 150 may be adjacent to the light source 110. Specifically, an external light source outputting broadband light is additionally arranged outside the EUV collector 200, the broadband light of the external light source is scattered by the spectrometer 150, and light of a required wavelength band is transmitted to the light source 110 through the optical fiber so that the light of the corresponding wavelength band may be output from the light source 110.

As illustrated in FIG. 15B, by scattering light through the spectrometer 150, a plurality of images in accordance with wavelengths may be captured by the camera 120. When the BP filters 130 are used, a plurality of images in accordance with wavelengths may be generated by the number of BP filters. However, when the spectrometer 150 such as the monochromator is used, the broadband light may be scattered into dozens to hundreds with a wavelength width of about several nm. Therefore, more data on image by wavelength and reflectance by wavelength may be obtained. As a result, based on data on reflectance in accordance with wavelengths beyond count, the contamination mode and the contamination amount of the EUV collector 200 may be more correctly predicted and, based on the contamination modeling and the statistical data analysis, the coherence of the prediction of the EUV reflectance of the EUV collector 200 may remarkably improve.

Figure 16:
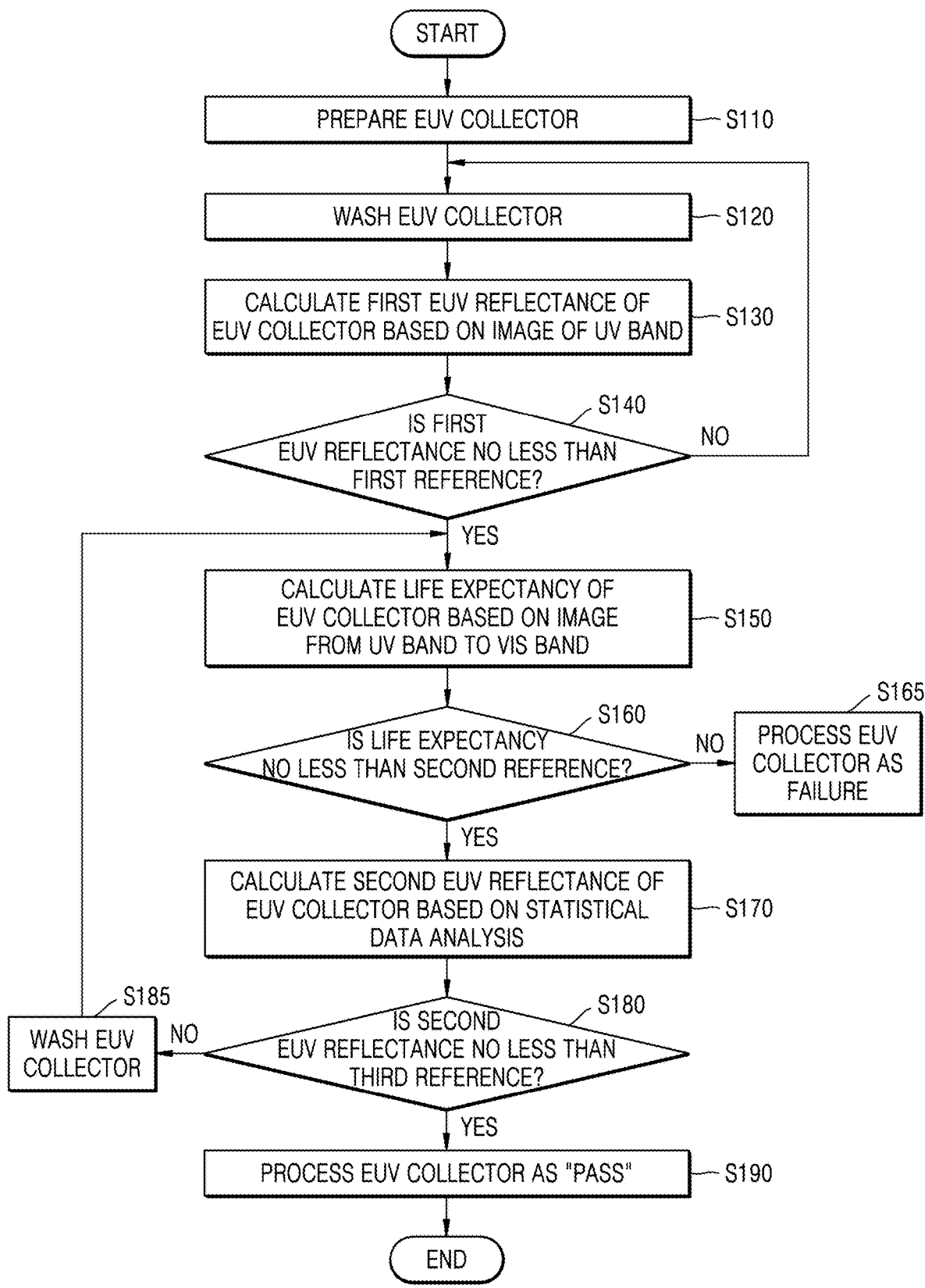
FIG. 16 is a flowchart schematically illustrating an EUV collector inspection method, according to an example embodiment of the inventive concept.

FIG. 16 is a flowchart schematically illustrating an EUV collector inspection method according to an example embodiment of the inventive concept. Description will be given with reference to FIG. 1 together and description previously given with reference to FIGS. 1 to 15B will be briefly described or omitted. One or more of the operations of FIG. 16 may be performed by the controller discussed above in connection with FIG. 1.

Referring to FIG. 16, in the EUV collector inspection method according to the example embodiment, first, the EUV collector 200 to be inspected is prepared in operation S110. Here, the EUV collector 200 may be contaminated by being used for no less than a set time in the EUV exposure process of the EUV equipment. The EUV collector 200 may be separated from the EUV equipment and prepared to be washed.

Next, the EUV collector 200 is washed by a washing machine in operation S120. After the EUV collector 200 is washed, a first EUV reflectance of the EUV collector 200 is calculated based on an image of the UV band in operation S130. More specifically, the EUV collector 200 may be arranged on the stage 140 of the EUV collector inspection apparatus 100 and light of the UV band may be output from the light source 110. In addition, to correspond to the light of the UV band, the image of the UV band may be captured by the camera 120. Then, based on the image of the UV band, the first EUV reflectance of the EUV collector 200 is calculated. Here, the first EUV reflectance may be roughly calculated for the EUV collector 200. For example, the first EUV reflectance may be extracted based on a contaminated area or position of Sn. Calculation of the first EUV reflectance will be described in more detail with reference to FIG. 17.

After calculating the first EUV reflectance, it is determined whether the first EUV reflectance is no less than a first reference in operation S140. For example, it may be determined whether the first EUV reflectance is equal to or greater than the first reference. The first reference may be stored in a memory, and may be retrieved from the memory to be compared with the calculated first EUV reflectance. The first reference may correspond to the minimum EUV reflectance of the EUV collector 200 that may be used by the EUV equipment. For example, the first reference may be 40%. However, the first reference is not limited to the above numerical value. When the first EUV reflectance is less than the first reference (operation S140, NO), a process may proceed to operation S120 of washing the EUV collector 200. On the other hand, according to an example embodiment, when the first EUV reflectance is less than the first reference, a process of comparing the first EUV reflectance with the minimum reflectance corresponding to failure may be further included and, when the first EUV reflectance is less than the minimum reflectance, the process may not proceed to operation S120 of washing the EUV collector 200 and may proceed to operation S165 of processing the EUV collector 200 as failure.

When the first EUV reflectance is no less than the first reference (operation S140, YES), the life expectancy of the EUV collector 200 is calculated based on image by wavelength from the UV band to the VIS band in operation S150. The life expectancy of the EUV collector 200 may be calculated in various methods. For example, the life expectancy of the EUV collector 200 may be calculated by extracting a contamination mode and an amount of contamination based on the contamination model and the database. Calculation of the life expectancy of the EUV collector 200 will be described in more detail with reference to FIG. 17.

After calculating the life expectancy of the EUV collector 200, it is determined whether the life expectancy of the EUV collector 200 is no less than a second reference in operation S160. For example, it may be determined whether the life expectancy of the EUV collector 200 is equal to or greater than the second reference. The second reference may be stored in a memory, and may be retrieved from the memory to be compared to the calculated life expectancy of the EUV collector 200. The second reference may correspond to the minimum time for which the EUV collector 200 may be normally used in the EUV equipment. However, the second reference may not be limited to the above-described concept and may be set by another concept. When the life expectancy of the EUV collector 200 is less than the second reference (operation S160, NO), a process proceeds to operation S165 of processing the EUV collector 200 as failure and the EUV collector 200 may not be mounted in the EUV equipment and may be discarded. According to an example embodiment, the EUV collector 200 may be repaired if possible.

When the life expectancy of the EUV collector 200 is no less than the second reference (operation S160, YES), second EUV reflectance of the EUV collector 200 is calculated based on the statistical data analysis in operation S170. The second EUV reflectance of the EUV collector 200 may be more correct. In addition, the second EUV reflectance may correspond to the EUV reflectance in a state in which the EUV collector 200 is mounted in the EUV equipment based on the statistical data analysis.

After calculating the second EUV reflectance, it is determined whether the second EUV reflectance is no less than a third reference in operation S180. For example, it may be determined whether the second EUV reflectance is equal to or greater than the third reference. The third reference may be stored in a memory, and may be retrieved from the memory to be compared with the calculated second EUV reflectance. The third reference may correspond to average EUV reflectance of the EUV collector 200 that may be used in the EUV equipment. However, the third reference may not be limited to the above-described concept and may be set by another concept. When the second EUV reflectance is less than the third reference (operation S180, NO), a process may proceed to operation S185 of washing the EUV collector 200. Operation S185 of washing the EUV collector 200 may be the same as operation S120 of washing the EUV collector 200. However, because the process may proceed to operation S150 of calculating the life expectancy of the EUV collector 200 after washing the EUV collector 200, for convenience sake, operation S185 of washing the EUV collector 200 is illustrated as being different from operation S120 of washing the EUV collector 200. When the second EUV reflectance is no less than the third reference (operation S180, YES), the EUV collector 200 is processed as being passed in operation S190 and the EUV collector inspection method may be terminated. On the other hand, the EUV collector 200 processed as being passed may be mounted in the EUV equipment and may be used in the EUV exposure process again.

Figure 17:
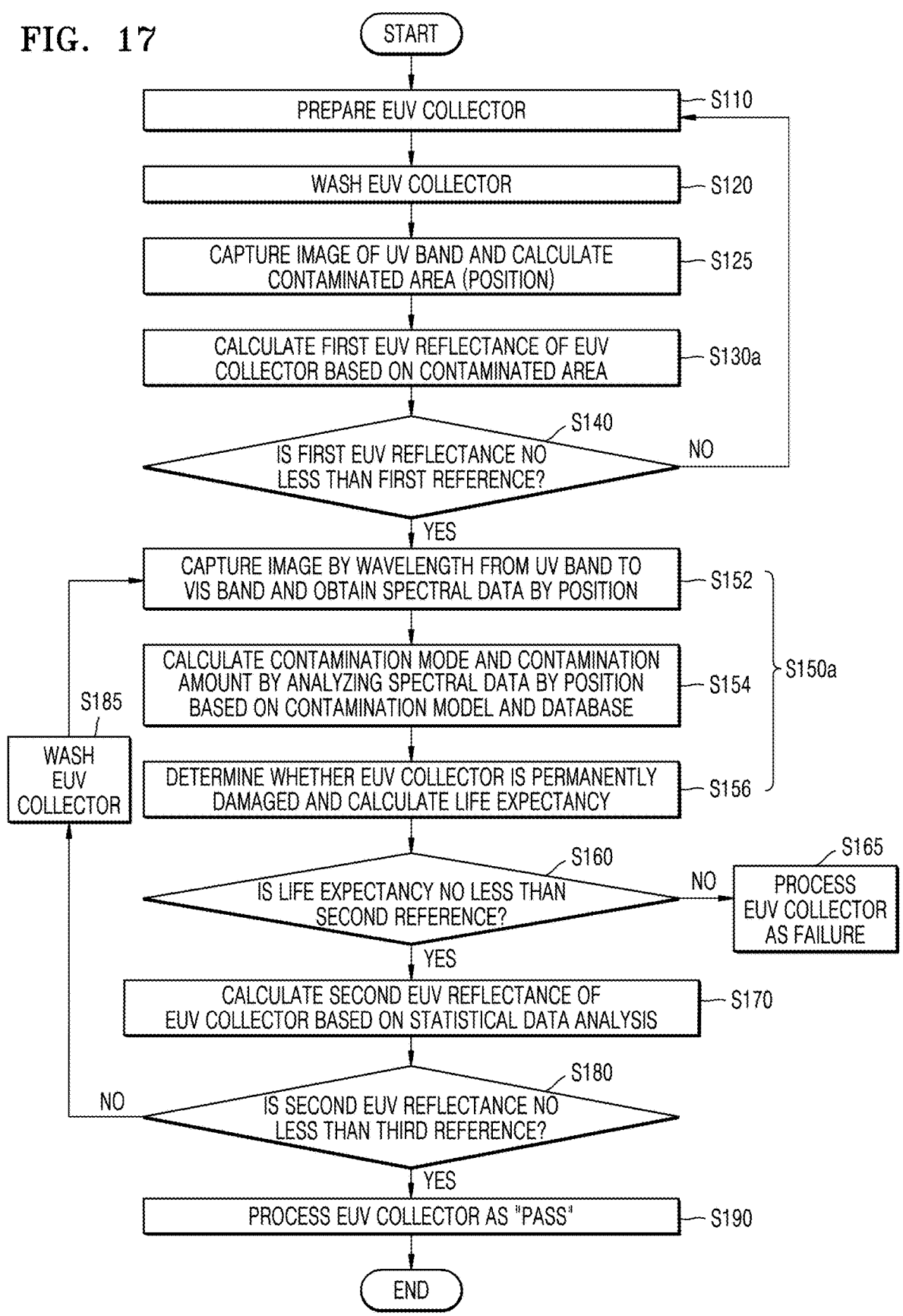
FIG. 17 is a flowchart schematically illustrating an EUV collector inspection method, according to an example embodiment of the inventive concept.

FIG. 17 is a flowchart schematically illustrating an EUV collector inspection method according to an example embodiment of the inventive concept. Description will be given with reference to FIG. 1 together and description previously given with reference to FIG. 16 will be briefly described or omitted. One or more of the operations of FIG. 17 may be performed by the controller discussed above in connection with FIG. 1.

Referring to FIG. 17, in the EUV collector inspection method according to the example embodiment, first, operation S110 of preparing the EUV collector 200 to be inspected and operation S120 of washing the EUV collector 200 are sequentially performed. Operation S110 of preparing the EUV collector 200 and operation S120 of washing the EUV collector 200 are the same as described with reference to FIG. 16.

Then, an image of the UV band is captured and a contaminated area is calculated in operation S125. Capturing the image of the UV band is the same as described with reference to FIG. 16. The contaminated area may mean an area of a region with low intensity or reflectance in the image of the UV band. The contaminated area may be calculated by obtaining a total value through an algorithm of dividing the EUV collector 200 into fine regions and comparing intensity or reflectance of each of the fine regions with a set reference value. As a specific example, when the total value obtained by dividing the EUV collector 200 into 100 regions and comparing the intensity or reflectance of each of the fine regions with the set reference value is 50, 50% of an area of the EUV collector 200 may be calculated as the contaminated area.

On the other hand, calculation of the contaminated area may include detection of a contaminated region or position. In addition, here, the EUV collector 200 may be contaminated by Sn being deposited on the surface of the EUV collector 200. Therefore, the contaminated area may correspond to a Sn deposited area of the surface of the EUV collector 200. However, the contamination is not limited to the deposition of Sn so that the contaminated area may not coincide with the Sn deposited area.

After calculating the contaminated area, the first EUV reflectance is calculated based on the contaminated area in operation S130a. The first EUV reflectance may be roughly calculated based on the contaminated area. For example, correlation between the contaminated area and the first EUV reflectance may be found out and the first EUV reflectance in accordance with the contaminated area may be calculated by using the correlation. On the other hand, the correlation may become more precise as data on the contaminated area increases.

After calculating the first EUV reflectance, it is determined whether the first EUV reflectance is no less than the first reference in operation S140. For example, it may be determined whether the first EUV reflectance is equal to or greater than the first reference. The first reference may be stored in a memory, and may be retrieved from the memory to be compared to the calculated first EUV reflectance. Operation S140 of determining whether the first EUV reflectance is no less than the first reference is the same as described with reference to FIG. 16.

When the first EUV reflectance is less than the first reference (operation S140, NO), a process may proceed to operation S120 of washing the EUV collector 200. When the first EUV reflectance is no less than the first reference (operation S140, YES), the life expectancy of the EUV collector 200 is calculated based on the image by wavelength from the UV band to the VIS band in operation S150a, which includes operations S152, S154, and S156.

Then, the image by wavelength from the UV band to the VIS band is captured and spectral data by position of the EUV collector 200 is obtained in operation S152. Here, the spectral data may mean data on intensity or reflectance in accordance with wavelength by position of the EUV collector 200. The spectral data by position may be stored in the database and the contamination model may be generated based on the spectral data by position. On the other hand, the contamination model is not limited to the spectral data by position and, as described above, may be generated based on the image by wavelength or the change in reflectance by wavelength.

After obtaining the spectral data, by analyzing the spectral data by position of the EUV collector 200 based on the contamination model and the database, the contamination mode and the contamination amount are calculated in operation S154. The contamination mode may include a kind of contamination and contamination by position. In addition, the contamination amount may mean a contamination degree or a contamination rate and may include the contamination amount and contamination amount by position of the EUV collector 200.

After calculating the contamination mode and the contamination amount, it is determined whether the EUV collector 200 is permanently damaged and the life expectancy of the EUV collector 200 is calculated in operation S156. Whether the EUV collector 200 is permanently damaged may be determined by, for example, a degree to which the Mo/Si multilayer 210 and the capping layer 220 of the EUV collector 200 are damaged. More specifically, as described above, because the EUV reflection of the EUV collector 200 is performed in the Mo/Si multilayer 210, whether the EUV collector 200 is permanently damaged may be mainly determined by the degree to which the Mo/Si multilayer 210 is damaged. However, considering that the capping layer 220 protects the Mo/Si multilayer 210, presence of the capping layer 220 may be also included in determination of whether the EUV collector 200 is permanently damaged.

On the other hand, the life expectancy of the EUV collector 200 may be calculated using various methods. For example, based on the previously calculated contamination mode and contamination amount, the life expectancy of the EUV collector 200 may be calculated. As a specific example, when the contamination mode indicates that the EUV collector 200 is contaminated by deposition of Sn, the life expectancy of the EUV collector 200 may be calculated to be longer, when the contamination mode indicates that the capping layer 220 is damaged, the life expectancy of the EUV collector 200 may be calculated to be median, and, when the contamination mode indicates that the Mo/Si multilayer 210 is damaged, the life expectancy of the EUV collector 200 may be calculated to be very short or it may be determined that the EUV collector 200 is permanently damaged. On the other hand, the contamination amount may be also considered in the calculation of the life expectancy of the EUV collector 200. For example, in the same contamination mode, the life expectancy of the EUV collector 200 may be calculated to be shorter when the contamination amount is large than when the contamination amount is small.

The operations from operation S152 of obtaining the spectral data to operation S156 of determining whether the EUV collector 200 is permanently damaged and calculating the life expectancy of the EUV collector 200 may be included in operation S150a of calculating the life expectancy of the EUV collector 200 based on the image by wavelength from the UV band to the VIS band.

After calculating the life expectancy of the EUV collector 200, it is determined whether the life expectancy of the EUV collector 200 is no less than the second reference in operation S160. Operation S160 of determining whether the life expectancy of the EUV collector 200 is no less than the second reference is the same as described with reference to FIG. 16. On the other hand, when it is determined that the EUV collector 200 is permanently damaged in operation S156 of calculating the life expectancy of the EUV collector 200, in operation S160 of determining whether the life expectancy of the EUV collector 200 is no less than the second reference, it may be determined that the life expectancy of the EUV collector 200 is less than the second reference (operation S160, NO), and the process may proceed to operation S165 of processing the EUV collector 200 as failure.

After operation S160 of determining whether the life expectancy of the EUV collector 200 is no less than the second reference, operation S165 of processing the EUV collector 200 as failure or operation S170 of calculating the second EUV reflectance of the EUV collector 200 is performed. In addition, operation S180 of determining whether the second EUV reflectance of the EUV collector 200 is no less than the third reference, operation S185 of washing the EUV collector 200 in accordance with the determination result, or operation S190 of processing the EUV collector 200 as being passed is performed. The above operations S165, S170, S180, S185, and S190 are the same as described with reference to FIG. 16.

While the inventive concept has been particularly shown and described with reference to embodiments thereof, it will be understood that various changes in form and details may be made therein without departing from the spirit and scope of the following claims.

What is claimed is:

1. An extreme ultraviolet (EUV) collector inspection apparatus comprising:
a light source arranged in front of an EUV collector to be inspected and configured to output light in a range from an ultraviolet (UV) band to a visible light (VIS) band;
a camera configured to perform imaging in the range from the UV band to the VIS band; and
an optical device optically-coupling the light source with the camera and configured to transfer narrowband light from the light output by the light source to the camera,
wherein an image for each wavelength of the EUV collector is obtained by using the optical device and the camera and a contamination state of the EUV collector is inspected.

2. The EUV collector inspection apparatus of claim 1, wherein the EUV collector is configured to focus and output EUV light from a plasma based EUV generating apparatus and comprises an elliptical mirror.

3. The EUV collector inspection apparatus of claim 2, wherein EUV reflectance of the EUV collector is calculated based on the image for each wavelength.

4. The EUV collector inspection apparatus of claim 3, wherein a contaminated area of the EUV collector is calculated by using the image for each wavelength and the EUV reflectance is calculated based on the contaminated area.

5. The EUV collector inspection apparatus of claim 3, wherein a contamination model is created based on the image for each wavelength and the EUV reflectance is calculated through statistical data analysis.

6. The EUV collector inspection apparatus of claim 2, wherein a contamination state by region of the EUV collector is inspected based on the image for each wavelength.

7. The EUV collector inspection apparatus of claim 2,
wherein the EUV collector comprises a substrate, a molybdenum (Mo)/silicon (Si) multilayer arranged on the substrate, and a capping layer on the Mo/Si multilayer,
wherein the contamination state of the EUV collector in accordance with deposition of a byproduct on the capping layer or damage of the capping layer or multilayer is inspected, and
wherein life expectancy of the EUV collector is calculated based on the contamination state.

8. The EUV collector inspection apparatus of claim 1, wherein the light source comprises one broadband light source or at least two light sources configured to output light components of different bands.

9. The EUV collector inspection apparatus of claim 1,
wherein the light source is spherical or columnar,
wherein, when the light source is spherical, the light source is spaced apart from the EUV collector by a set distance, and
wherein, when the light source is columnar, the light source extends from the EUV collector to the camera.

10. The EUV collector inspection apparatus of claim 1, wherein the optical device is a band-pass (BP) filter transmitting only the narrowband light.

11. The EUV collector inspection apparatus of claim 1, wherein the optical device is a spectrometer configured to split the light into the narrowband light.

12. An extreme ultraviolet (EUV) collector inspection apparatus comprising:
a stage on which an EUV collector to be inspected is arranged and which is configured to support the EUV collector;
a broadband light source arranged in front of the EUV collector and configured to output light in a range from an ultraviolet (UV) band to a visible light (VIS) band;
an optical device arranged in front of the broadband light source and configured to transmit narrowband light from the light output by the broadband light source or to split the light output by the broadband light source into narrowband light; and
a camera configured to perform imaging on the narrowband light transmitted through the optical device and to generate an image for each wavelength,
wherein the EUV collector is a part configured to focus and output EUV light from a plasma based EUV generating apparatus,
wherein the camera is a highly sensitive camera configured to perform imaging in the range from the UV band to the VIS band, and
wherein a contamination state of the EUV collector is inspected based on the image for each wavelength.

13. The EUV collector inspection apparatus of claim 12,
wherein the EUV collector comprises a substrate, a molybdenum (Mo)/silicon (Si) multilayer arranged on the substrate, and a capping layer on the Mo/Si multilayer, and
wherein a contamination state of the EUV collector in accordance with deposition of a byproduct on the capping layer or damage of the capping layer or multilayer is inspected.

14. The EUV collector inspection apparatus of claim 12,
wherein the broadband light source is spherical or columnar,
wherein, when the broadband light source is spherical, the light source is spaced apart from the EUV collector by a set distance, and
wherein, when the broadband light source is columnar, the light source extends from the EUV collector to the camera.

15. The EUV collector inspection apparatus of claim 12, wherein EUV reflectance of the EUV collector is calculated or contamination state by region of the EUV collector is inspected based on the image for each wavelength.

16. The EUV collector inspection apparatus of claim 12,
wherein EUV reflectance of the EUV collector is calculated based on a contaminated area of the EUV collector, and
wherein a contamination model is created based on the image for each wavelength and the EUV reflectance of the EUV collector is calculated through statistical data analysis.

17. The EUV collector inspection apparatus of claim 12, wherein the EUV collector is washed, discarded, or mounted in EUV equipment in accordance with the contamination state.

18. An extreme ultraviolet (EUV) collector inspection apparatus comprising:
a light source arranged in front of an EUV collector to be inspected and configured to output light in a range from an ultraviolet (UV) band to a visible light (VIS) band;
an optical device arranged in front of the light source and configured to transmit narrowband light from the light output by the light source or to split the light output by the light source into narrowband light; and
a camera optically-coupled to the light source by the optical device and configured to receive the narrowband light transmitted through the optical device, perform imaging in the range from the UV band to the VIS band, and generate an image for each wavelength,
wherein the image for each wavelength of the EUV collector is obtained by using the optical device and the camera, and a contamination state of the EUV collector is inspected based on the image for each wavelength, and
wherein the EUV collector is configured to focus and output EUV light from a plasma based EUV generating apparatus and comprises an elliptical mirror.

19. The EUV collector inspection apparatus of claim 18,
wherein the EUV collector comprises a substrate, a molybdenum (Mo)/silicon (Si) multilayer arranged on the substrate, and a capping layer on the Mo/Si multilayer, and
wherein the contamination state of the EUV collector in accordance with deposition of a byproduct on the capping layer or damage of the capping layer or multilayer is inspected.

20. The EUV collector inspection apparatus of claim 18, wherein the light source is spherical or columnar,
wherein, when the light source is spherical, the light source is spaced apart from the EUV collector by a set distance, and
wherein, when the light source is columnar, the light source extends from the EUV collector in a direction the camera is placed.

\* \* \* \* \*